United States Patent [19]

Mount et al.

[11] Patent Number: 5,317,275
[45] Date of Patent: May 31, 1994

[54] CONDUCTANCE MEASUREMENT CIRCUIT WITH WIDE DYNAMIC RANGE

[75] Inventors: Bruce E. Mount, Diamond Bar; Myron Von Esch, Chino, both of Calif.

[73] Assignee: Orbital Sciences Corporation, Dulles, Va.

[21] Appl. No.: 820,457

[22] Filed: Jan. 13, 1992

[51] Int. Cl.$^5$ .............................................. G01R 27/26
[52] U.S. Cl. ...................... 324/692; 324/444; 328/145
[58] Field of Search ............... 324/692, 693, 439; 128/734, 635; 204/406; 328/145; 307/492

[56] References Cited

U.S. PATENT DOCUMENTS

| | | | |
|---|---|---|---|
| 2,877,348 | 3/1959 | Wade et al. | 328/145 |
| 3,090,011 | 5/1963 | Hammer | 328/145 |
| 3,108,197 | 10/1963 | Levin | 328/145 |
| 3,500,198 | 3/1970 | Kaiser et al. | 328/145 |
| 3,576,491 | 4/1971 | Thornton | 324/62 |
| 4,042,465 | 8/1977 | Merong, III et al. | 204/406 |
| 4,048,041 | 9/1977 | David et al. | 204/406 |
| 4,072,578 | 2/1978 | Cady et al. | |
| 4,091,329 | 5/1978 | Fletcher | 328/145 |
| 4,436,610 | 3/1984 | Enzer et al. | |
| 4,672,322 | 6/1987 | Gratteau et al. | 204/406 |
| 4,683,435 | 7/1987 | Blades | 204/406 |
| 4,701,253 | 10/1987 | Ligtenberg et al. | 204/406 |
| 4,795,542 | 1/1989 | Ross et al. | |
| 4,808,931 | 2/1989 | Ling | 324/444 |
| 4,882,030 | 11/1989 | Suzuki et al. | 204/406 |
| 4,908,105 | 3/1990 | Garner, Jr. | |
| 4,909,908 | 3/1990 | Ross et al. | |

Primary Examiner—Kenneth A. Wieder
Assistant Examiner—Maura K. Regan
Attorney, Agent, or Firm—Jenner & Block

[57] ABSTRACT

A conductance measurement circuit to measure conductance of a solution under test with an output voltage proportional to conductance over a 5-decade range, i.e., 0.01 uS to 1000 uS or from 0.1 uS to 10,000 uS. An increase in conductance indicates growth, or multiplication, of the bacteria in the test solution. Two circuits are used each for an alternate half-cycle time periods of an alternate squarewave in order to cause alternate and opposite currents to be applied to the test solution. The output of one of the two circuits may be scaled for a different range optimum switching frequency dependent upon the solution conductance and to enable uninterrupted measurement over the complete 5-decade range. This circuitry provides two overlapping ranges of conductance which can be read simultaneously without discontinuity thereby eliminating range switching within the basic circuitry. A VCO is used to automatically change the operating frequency according to the particular value of the conductance being measured, and comparators indicate which range is valid and also facilitate computer-controlled data acquisition. A multiplexer may be used to monitor any number of solutions under test continuously.

19 Claims, 7 Drawing Sheets

CONDUCTANCE MEASUREMENT CIRCUIT WITH WIDE DYNAMIC RANGE

GOVERNMENT RIGHTS

The invention described herein was made in the performance of work under NASA contract No. NAS 8-50000 and is subject to the provisions of the National Aeronautics and Space Act of 1958 (42 U.S.C.2457).

BACKGROUND OF THE INVENTION

1. Purpose and Requirements of the Invention

A circuit was needed to measure conductance, with an output voltage proportional to conductance, over a five decade range, such as from 0.01 microSiemens (uS) to 1000 microSiemens (uS) or 0.1 microSiemens (uS) to 10,000 microSiemens (uS).

(Definitions of resistivity, conductance, and conductivity are given in Appendix II.)

The primary use of the circuit would be to measure the conductance of solutions, such as in those solutions containing biological growth media in a bacteriological sample, where an increase in the conductance of the solution indicates growth, or multiplication, of the bacteriological colonies. FIG. 1 illustrates schematically a typical chamber 10 containing a test solution with electrodes 1 and 2 within the solution. The electrodes are used to apply current to the test solution. More information about one type of such chambers and electrodes is available in the U.S. Pat. No. 4,072,578 to Cady et al.

1. One requirement of this type of measurement circuit is that the current used to measure the conductance of the solution must alternate in polarity and contain an insignificant component of net direct current in order to minimize polarization of, or electrically induced changes to, the measuring electrodes in the solution.

2. Another requirement is that the measurement of solution conductance must ignore the effects of electrode capacitance of the solution conductance (generally in solutions the inductive component is negligible) and only measure the dissipative component of the solution conductance (due to solution resistance).

3. A further requirement is to maximize the dynamic range of the output measurement (minimize the switching of ranges) to facilitate computer-controlled operation.

4. A further requirement is that the conductance output signal be essentially immune to the effects of ambient temperature changes to the circuit components over an operating range of 0 to 55 degrees Centigrade.

3. Prior Art

Background Information

Conventional conductance circuits utilize circuitry which applies alternating current to the electrodes to minimize the effects of electrode polarization and thus meet requirement No. 1 above. Also, conventional conductance measurement circuits ignore the effects of capacitive load components by exciting the load with square current signals and sampling the voltage after the capacitive components are charged and thus meet requirement #2 above.

The dynamic range of measurement of conventional circuits, however, is limited because of the use of linear gain circuitry which requires switching of several ranges. In addition, conventional circuitry will generally provide for operation at typically two different frequencies, but generally the frequency change must be effected in discrete steps along with switching of ranges.

A basic circuit which produces an output proportional to conductance is shown in FIG. 2, in which AR1 is an operational amplifier, $R_T$ is a resistance whose conductance is to be measured, R is a fixed resistance, $e_i$ is a fixed input DC voltage, and $e_o$ is the output voltage. The expression for the output voltage is $$e_o = -e_i \frac{R}{R_T} \qquad (1)$$

The conductance, $G_T$, of the test resistance $R_T$ is $$G_T = \frac{1}{R_T} \qquad (2)$$

Combining eqs. (1) and (2) we obtain $$e_o = -e_i R G_T \qquad (3)$$

If $e_i$ and R are constants, and $k=e_iR$, equ. (3) becomes $$e_o = k G_T \qquad (4)$$

which shows that the output voltage $e_o$ is proportional to the conductance $G_T$ of the resistance $R_T$ under test. Measurement of the conductance of $R_T$ in FIG. 2 is accomplished by applying a known, fixed value of DC current through $R_T$ and developing a voltage, $e_o$, proportional to its conductance. If $R_T$ is the resistance of a solution in which electrodes are used to apply current as in FIG. 2, then, in order to minimize electrode polarization effects, the current through $R_T$ must be made to move in alternate directions at typical rates of a few hundred to a few thousand Hertz. When electrodes are used to measure the conductance of a solution, a capacitive component commonly appears along with the resistive component, the capacitive component being due to the interaction of the electrode with the ionized fluid in the solution under test.

One commonly used circuit configuration for applying alternating current to a solution under test and producing an output proportional to conductance which depends upon only the resistive component, $R_T$, and not the capacitive component, $C_T$, is shown in FIG. 3a. The input voltage, $e_i$, is now a squarewave of typically a few hundred to a few thousand Hertz (FIG. 3b), which causes a corresponding squarewave of alternating current to flow through $R_T$ and $C_T$. The output of AR1 (FIG. 3c), is a positive and negative exponential voltage due to the charging of $C_T$ alternately toward the potentials $-Vo$ and $+Vo$. Without the capacitor $C_T$, the output waveform would be as shown in dashed lines in FIG. 3c. If the amplitude of the output waveform is sampled after the capacitance is fully charged, only the effect of $R_T$ will be measured, and $C_T$ will be ignored. Switches S1 and S2 are activated at times t1 and t2, respectively, (FIGS. 3d and 3e), and AR2 causes inversion of the negative sampled voltage. A voltage, $e_o$ (FIG. 3f), proportional to only the resistive portion of the conductance of the solution, appears at hold capacitor C1. Buffer amplifier AR3 provides a low impedance output.

Limitation of Previous Method

The circuit of FIG. 3a produces an output proportional to conductance, but only over a limited range of conductances; a practical range of operation for this circuit might be over an output range of $e_o$ from $+30$ mV to $+10$ V, or a conductance measurement range of 333-to-1. To operate over a 5-decade range, or a 100,000-to-1 dynamic range, some means of range switching would be required, such as changing the value of R in FIG. 3 (Ra and Rb) so that $e_o$ would always stay within $+30$ mV to $+10$ V. For example, if $e_i$ were assumed to be $+/-1$ V, a required total measurement range of 0.01 uS to 1000 uS, and $e_o = 30$ mV to 10 V, two different values of R would be required to be switched into the circuit of FIG. 3, as shown in Table I:

TABLE I

| Conductance Range | Resistance Range | Value of R |
|---|---|---|
| 3 uS to 1000 uS | 1 k to 333 k | 10 k |
| .01 uS to 3 uS | 333 k to 100M | 3.3M |

It is therefore an object of this invention to improve the prior art and provide the following:

1. Ability to measure conductance in one continuous five decade range which may be read out in two overlapping ranges to reduce the dynamic range requirements of a practical data acquisition system,
2. Automatic range indication to facilitate computer-controlled data acquisition,
3. Temperature compensation inherent in the design,
4. Optimum operating frequency automatically selected according to conductance value being measured.

SUMMARY OF THE INVENTION

To meet the foregoing objects, a conductance measurement circuit is provided to measure conductance of a solution under test with an output voltage proportional to conductance over a 5-decade range, i.e., 0.01 uS to 1000 uS or 0.1 uS to 10,000 uS. An increase in conductance indicates growth, or multiplication, of the bacteria in the test solution. Two circuits are used each for an alternate half-cycle time periods of an alternate squarewave in order to cause alternate and opposite currents to be applied to the test solution. The output of the one of two circuits may be used to provide control for a different optimum switching frequency dependent upon the solution conductance and to enable uninterrupted measurement over the complete 5-decade range. This circuitry provides two overlapping ranges of conductance which can be read simultaneously without discontinuity thereby eliminating range switching within the basic circuitry. A VCO automatically changes the operating frequency according to the particular value of the conductance being measured, and comparators indicate which range is (or ranges are) valid and also facilitate computer-controlled data acquisition. Many test solutions may be monitored by the use of a multiplexer in the measurement circuitry.

DETAILED DESCRIPTION OF PREFERRED EMBODIMENT

Basic Principles

The present invention enables measurement of at least 5-decades of conductance over one continuous range, eliminating the need for range switching within the basic measurement circuit. Two overlapping output ranges are used, but, unlike the discrete ranges required for the circuit of FIG. 3a, the overlapping values can be read simultaneously, so that no discontinuities of readings must be tolerated.

Figure 4A:
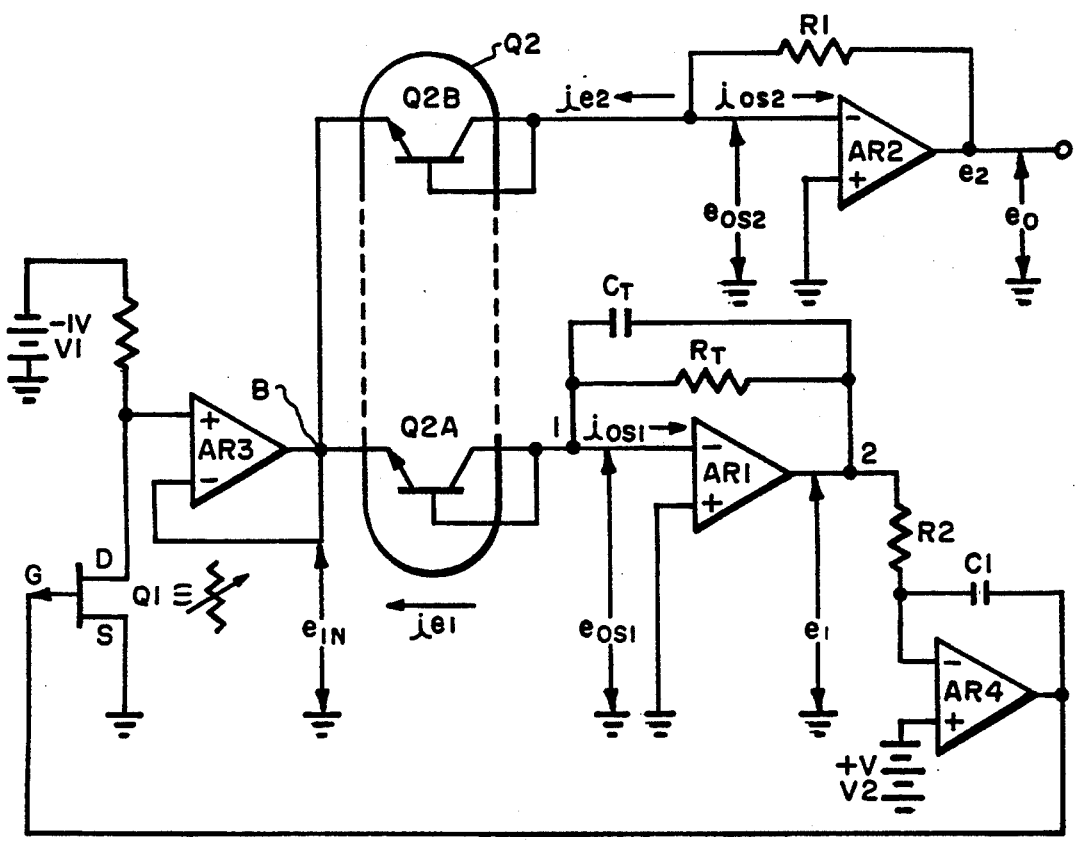
FIG. 4b is a schematic and accompanying table illustrating the operation of the circuitry of FIG. 4a, FIG. 5 is a schematic of a conductance measurement circuit of this invention.

FIG. 4a is a schematic of the basic portion of the measurement circuit of this invention without the additional circuitry required to periodically reverse the current to allow the principles of operation to be more easily explained. Resistance $R_T$ and conductance $C_T$, representing the solution conductance G to be measured, are connected from the output of operational amplifier AR1 to the negative input of AR1. The negative input of AR1 is connected to a common-base connected transistor Q2A whose emitter is connected at node B to a buffer amplifier AR3. The positive input of AR3 is connected to the drain of p-channel FET transistor Q1 and to a voltage reference V1 of $-1$ V. The output of AR1 is connected through a resistor R2 to a comparator AR4 which compares the voltage $e_1$ at the output of AR1 to a precise voltage reference V2 of $+1$ V. Capacitor C1 is connected to the output of AR4 and its negative input. R2 and C1 form an RC network for loop compensation. The output of the comparator is connected to the gate of the FET transistor Q1. The emitter of Q2A is also connected at node B to the emitter of the common-base connected transistor Q2B and transistor Q2B is connected to the negative input of an inverting amplifier AR2. Transistor Q2A, connected to function as a diode, becomes a variable input resistance to control the input current to AR1 according to the magnitude of voltage $e_1$. To cover the conductance range of 0.01 uS to 1000 uS, the input current to AR1 must vary from 10 nA to 1 mA, and over this range, $e_{in}$ need only vary from about 220 mV to 700 mv due to the logarithmic characteristic of the diode-connected transistor Q2A. See App I. The output voltage $e_1$ of AR1 is maintained at $+1.000$ volt DC by comparing the output voltage $e_1$ to a precise reference voltage V2 of +1.000 volt and feeding the amplified error signal back to transistor Q1 which acts as a voltage-variable attenuator, varying the amplitude of $e_{in}$, which adjusts the input current to AR1, tending to stabilize the output of AR1 at +1.000 volt. Increasing $R_T$ requires a reduced current to be supplied through Q2A in order to maintain $e_1$ at exactly +1.000 volt; the error voltage at the output of AR4 changes in the negative direction, causing the effective resistance of Q1 to decrease, reducing $e_{in}$, and restoring $e_1$ to +1.000 volt. An output proportional to the conductance of $R_T$ is obtained by applying $e_{in}$ to Q2B which has very nearly identical characteristics to Q2A, as they are specified as a matched pair, and manufactured on the same die. Therefore, if $e_{os1}$, $e_{os2}$, $i_{os1}$, and $i_{os2}$ are sufficiently close to zero, $i_{e1}$ and $i_{e2}$ will be equal, since the same voltage appears across Q2A and Q2B.

($e_{os1}$ is the voltage between the negative input of AR1 and ground, $e_{os2}$ is the voltage between the negative input of AR2 and ground, $i_{os1}$ is the current flow to the negative input of AR1 and $i_{os2}$ is the current flow to the negative input of AR2. Current $i_{e1}$ is the current flow through Q2A and $i_{e2}$ is the current flow through Q2B).

Resistor R1 is chosen such that when $R_T$ is the minimum desired resistance (maximum conductance) $e_o$ corresponds to the desired full-scale voltage. Appendix I describes in detail the mathematical relationships which show that output $e_o$ is linearly proportional to the conductance of $R_T$ and insensitive to temperature changes.

Figure 4B:
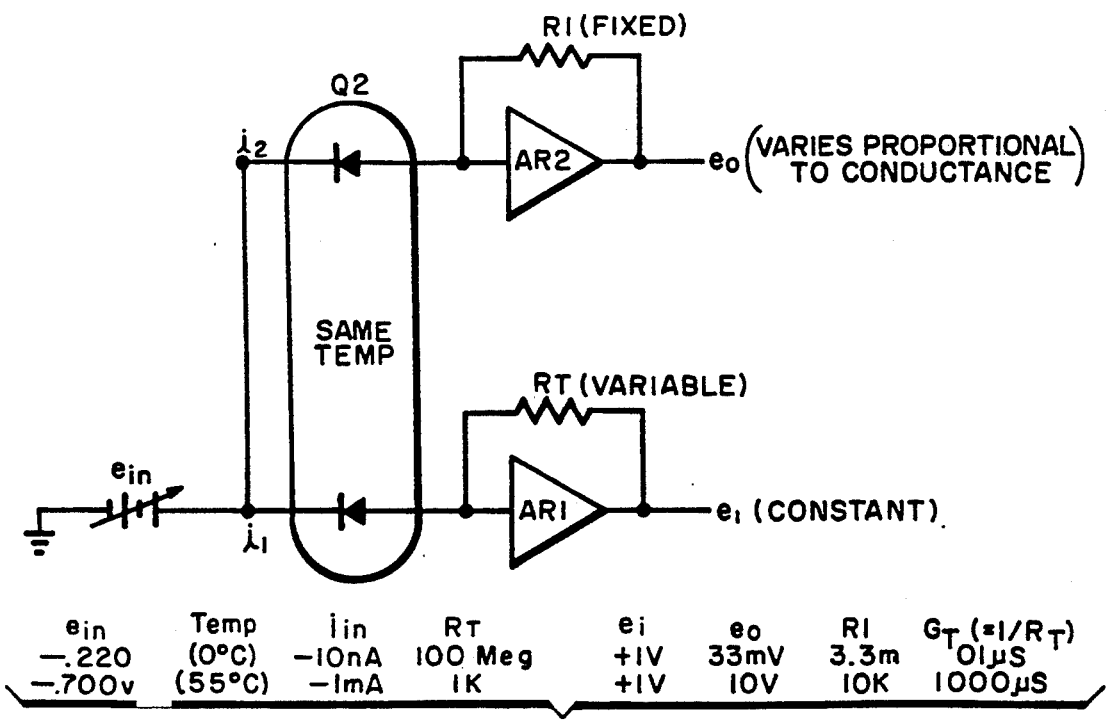

FIG. 4b is a schematic of a portion of the circuitry of FIG. 4a to emphasize and delineate the function of the matched transistor Q2 (Q2A and Q2B of FIG. 4a) with the latter being replaced by diodes D2A and D2B. D2A and D2B operate at the same temperature since they are a matched pair. Voltage $e_{in}$ is shown as a variable voltage source and the resistance $R_T$ is identified as variable and resistor R1 is identified as fixed. This figure also shows, in the accompanying table, that a small change in voltage at $e_{in}$ produces a large change in current, $i_{in}$ accomodating a large variation in conductance, while the output voltage $e_1$ is held constant and $e_0$ varies in proportion to conductance of the solution under test. This information is stated in Appendix I but restated in this figure for emphasis. While the table in 4b shows $e_1$ as +1 V, the total conductance range of this circuit may be changed from the range of 0.01 uS to 1000 uS to a range of 0.1 uS to 10,000 uS by reducing $e_1$ to 0.1 V.

Additions Required for Measuring Solution Conductance

The circuit of FIG. 4a is sufficient for measuring conductances which are not subject to polarization effects (if $C_T$ is present, it is ignored because the current through $R_T$ is flowing only in one direction). When the conductance of a solution must be measured, the circuit of FIG. 4a is modified as in FIG. 5. Here, two circuits similar to FIG. 4a are superimposed, and each is utilized for alternate half cycle time periods in order to cause alternate equal and opposite currents in $R_T$ and $C_T$. The same scheme is used for ignoring the effects of the shunt capacitance $C_T$ as was described for the circuit of FIG. 3, e.g., sampling the output of AR1 after $C_T$ has fully charged, just before reversing the polarity of the excitation current. All of the equations of Appendix I apply directly to the circuit of FIG. 5.

Figure 5:
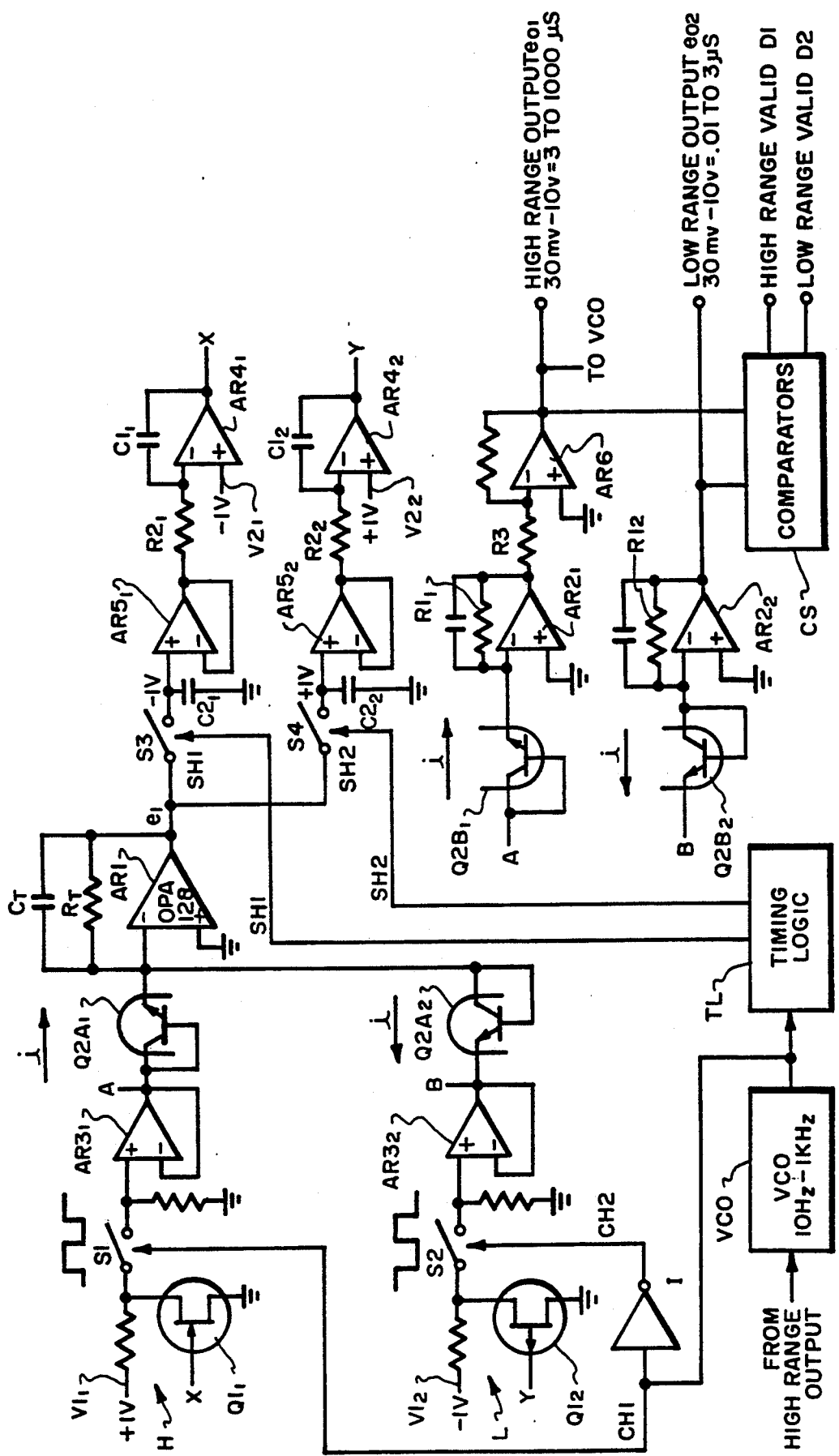

The two circuits are identified on the left of FIG. 5 as H for high range and L for low range with high and low range outputs $eo_1$ and $eo_2$, respectively, and identified on the right of FIG. 5. It should be apparent that the low range circuit is almost identical with the circuitry of FIG. 4a and has a p-channel FET $Q1_2$ while the high range circuit has an n-channel FET $Q2_1$. To simplify the description of the circuits, the high range circuit will have the same reference identifications to identify identical components as in FIG. 4a but with the subscript 1, and the low range circuit will have the same reference identifications as in FIG. 4a but with the subscript 2.

In FIG. 5, the resistance $R_T$ and capacitance $C_T$ are connected across operational amplifier AR1 as in FIG. 4a. Since this amplifier serves both circuits, it has not been given a subscript. The negative input of AR1 is connected the same as in FIG. 4a but an analog switch S1 is interposed between $Q1_1$ and AR3, the emitter of Q2A is connected to the negative input of AR3, and $V1_1$ is a positive voltage source. The output $e_1$ of AR1 is connected through analog switch S3 to one side of capacitor $C2_1$ and to the positive input of buffer amplifier $AR\%_1$. The other side of capacitor $C2_1$ is grounded. The positive side of capacitor $C2_1$ and the output of $AR5_1$ are connected through resistance $R2_1$ to comparator $AR4_1$ which compares voltage $e_1$ with a precise voltage source $V2_1$ of −1.000 V. The capacitor $C1_1$ and resistor $R2_1$ form an RC network for loop compensation. The output of $AR4_1$ is connected back to the gate of $Q1_1$. $AR3_1$ is connected at node A to transistor $Q2B_1$, as in FIG. 4a, and to inverter $AR2_1$, through resistor R3 to AR6, connected to operate as a low pass filter, whose output is $e_{o1}$, the high range output. The inverter $AR2_1$ reverses the polarity of the output of $Q2B_1$ so that $eo_1$ is positive.

The low range circuit is almost identical to the circuit of FIG. 4a except that an analog switch S2 is interposed between $Q1_2$ and $AR3_2$ and the output $e_1$ of AR1 is connected through an analog switch S4, to one side of capacitor $C2_2$ and to the positive input of a buffer amplifier $AR5_2$. The other side of capacitor $C2_2$ is grounded. The output of $AR5_2$ is connected to the negative input of comparator $AR4_2$ through resistance $R2_2$ to compare the output of $AR5_2$ with voltage source $V2_2$. $V2_2$ is a precise positive voltage source of +1 V connected to the positive input of $AR4_2$. $C1_2$ and $R2_2$ form an RC network for loop compensation. The output of $AR4_2$ is fed back to $Q1_2$ and transistor $Q2B_2$ is connected to $AR2_2$, connected as a low pass filter which provides the low range output $e_{o2}$. No reversal of polarity is required to provide a positive output $eo_2$.

In this circuitry, the high range output voltage $e_{o1}$ is connected to the input of a voltage control oscillator, shown as a block diagram VCO, and its output is connected as CH1 directly to switch S1 and also through an inverter I as CH2 to switch S2. The output of the VCO is also connected to a timing logic circuit, shown as a block diagram TL, whose output is connected via SH1 to switch S3 and via SH2 to switch S4. Finally, both high and low range output voltages $e_{o1}$ and $e_{o2}$ are connected to two comparators, shown as a block diagram CS.

Optimum Switching Frequency

The optimum switching frequency depends upon the solution conductance. For high conductances in the range of 3 uS to 1000 uS, a frequency of 400 Hz to 1 kHz is preferred, and for low conductances in the range of 0.01 uS to 3 uS, a lower frequency of 10 Hz to 400 Hz is preferred. To enable uninterrupted measurement of conductance over the complete 5-decade range, the VCO changes the operating frequency according to the particular value of conductance being measured. At 0.01 uS, the operating frequency is approximately 10 Hz, linearly increasing to 1 kHz at a conductance of 1000 uS. The VCO in FIG. 5 is controlled by output voltage $e_{o1}$, so that its output varies from 10 Hz to 1000 Hz as $e_{o1}$ varies from 0 V dc to 10 V dc.

Operation of Switching Circuits, Sample and Hold Circuits, and Timing Logic

Figure 6:
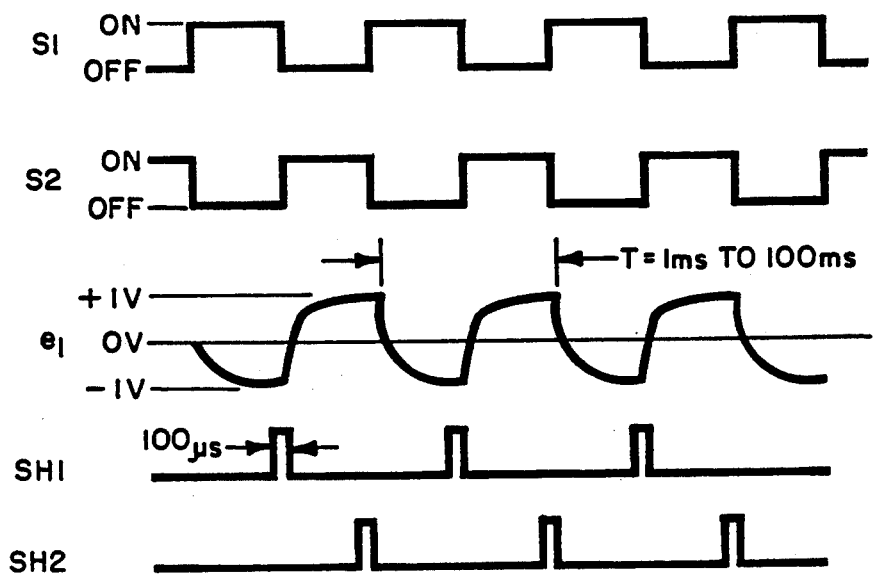
FIG. 6 is timing diagram of the circuit of FIG. 5.

As shown in FIG. 6, the output waveform from the VCO in FIG. 5 is a symmetrical squarewave which is connected to analog switch S1. This waveform is inverted and connected to analog switch S2. Therefore, channel 1 is operative while channel 2 is off, and channel 1 is off while channel 2 is on. As the timing diagram shows, the waveform at $e_1$ indicates an initial slow rise while capacitor $C_T$ charges, then a flattening or stabilization toward the end. While S1 is on, the waveform at $e_1$ is negative-going. At the end of the negative-going portion of the waveform at $e_1$, the SH1 pulse momentarily closes switch S1 charging capacitor $C2_1$ to the peak negative voltage of the waveform. The capacitance of $C2_1$ is sized so that the charge on $C2_1$ discharges an insignificant amount during a half-cycle of the timing waveform through the high shunt resistance presented by buffer amplifier $AR5_1$. S3, $C2_1$ and $AR5_1$ are connected to form a sample-and-hold circuit. The time constant of $R2_1$ and $C1_1$ is long enough to provide loop compensation sufficient to allow the voltage at $e_1$ to be stabilized at $-1$ V during the intervals that S1 is on. When S2 is on, $e_1$ is stabilized at $+1$ V in a similar manner.

Figure 7:
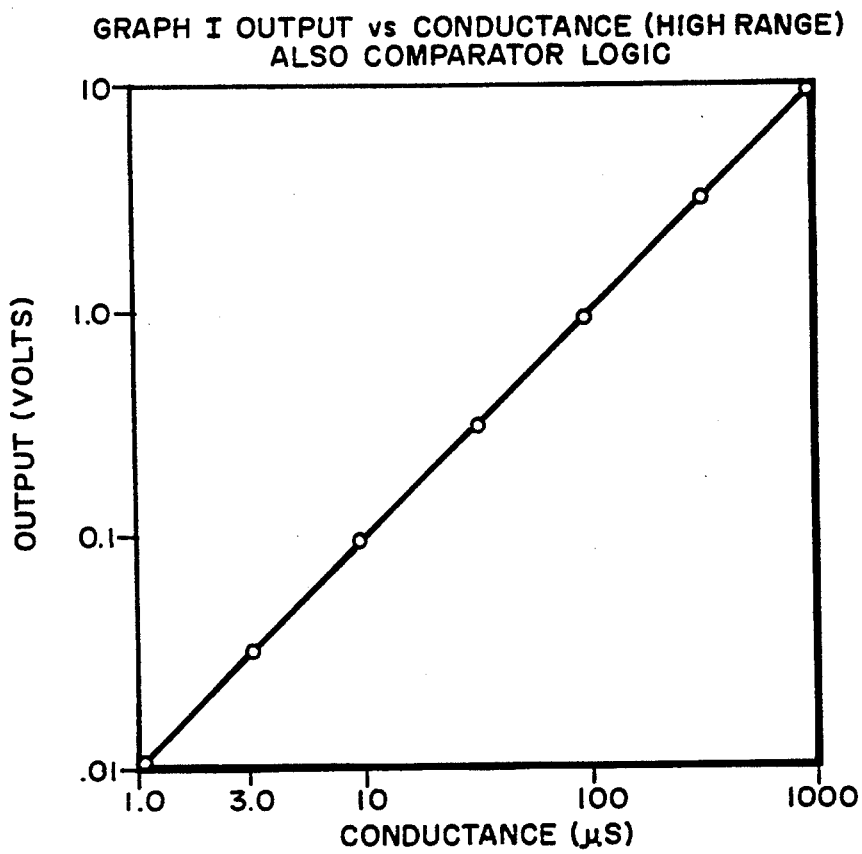
FIG. 7 is a graph of output versus conductance (high range) as a calibration standard.
Figure 7:
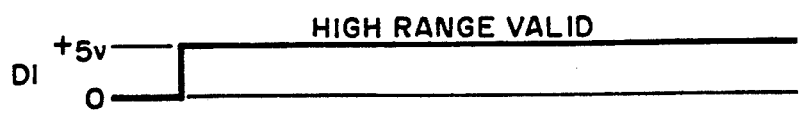
Figure 8:
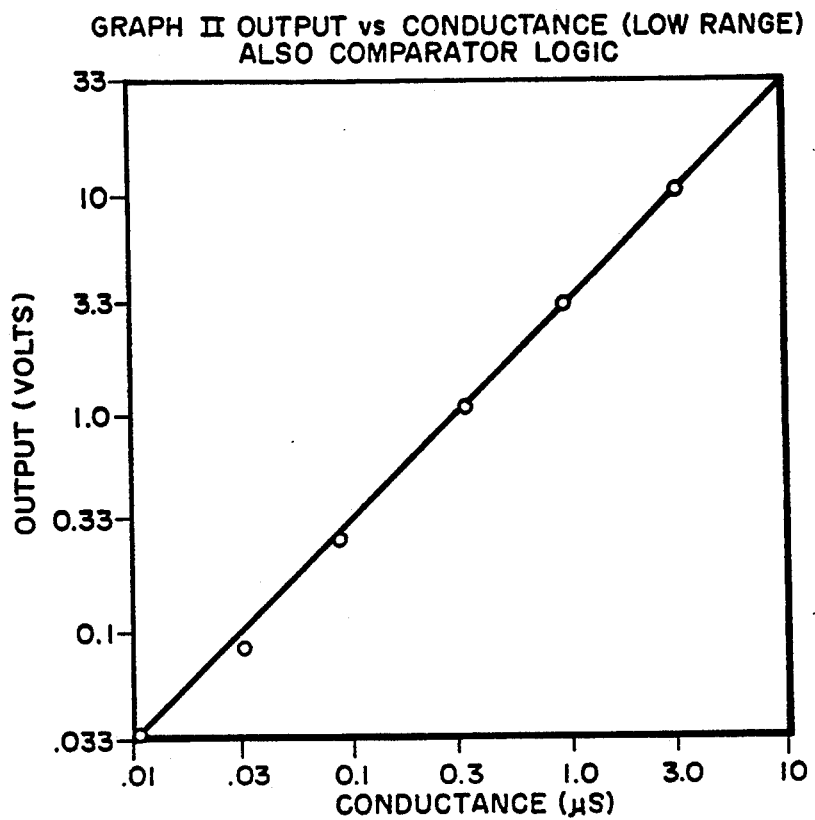
FIG. 8 is a graph of output versus conductance (low range) as a calibration standard.

FIGS. 7 and 8 are graphs of output versus conductance and comparator logic with the reference voltages $V2_1$ and $V2_2$ at 1 V. FIG. 7 is a graph of the high range and FIG. 8 is a graph of the low range. These graphs are actual circuit output data which were used to standardize the conductance measurement circuit and also clearly show the overlapping of the ranges for continuity.

Automatic Range Indicators

Figure 9:
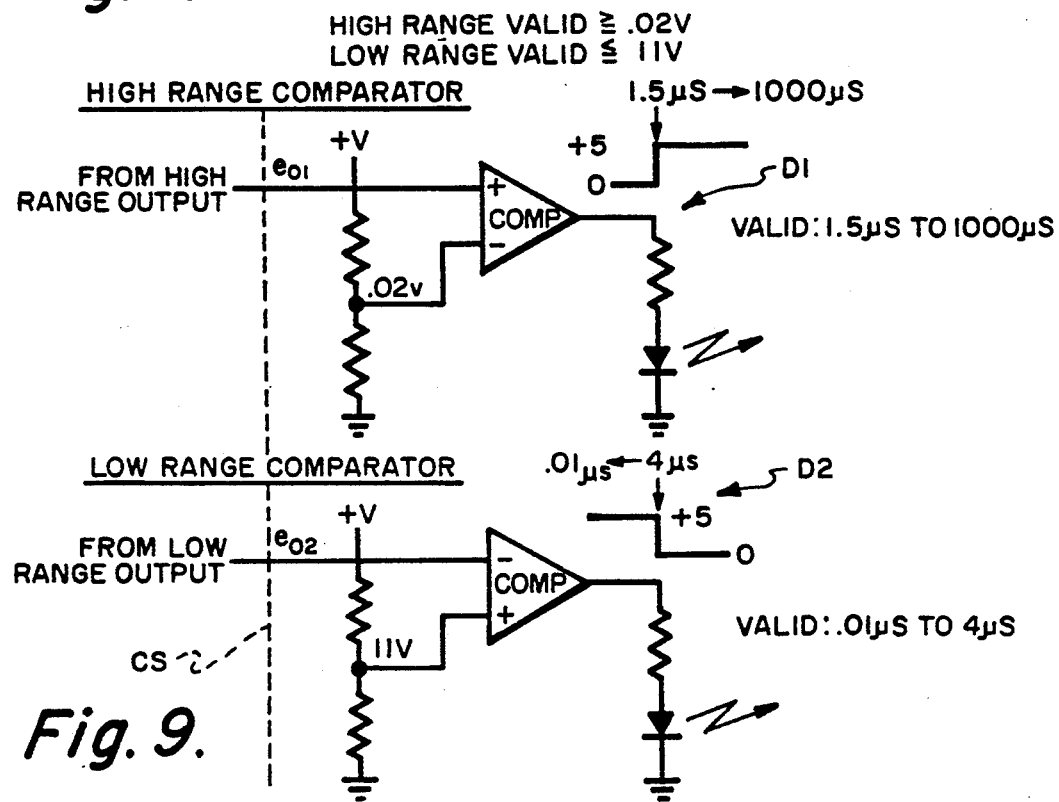
FIG. 9 is a schematic diagram of high and low range comparators.

Logic levels D1 and D2, 0 to $+5$ V, (FIGS. 7 and 8) are used to indicate which of the two outputs, high range output $e_{o1}$ and/or low range output $e_{o2}$, are valid. As shown in FIG. 9, two comparators, one, identified as High Range Comparator, compares the high range output to a reference voltage of approximately 20 mV, which represents the output present when the conductance under test has a value of approximately 2 uS. The comparator output is a high logic level when the conductance is 2 uS or above. Similarly, the second comparator, identified as Low Range Comparator, compares the low range output to a reference voltage of approximately 11 V, which represents the output present when the conductance under test has a value of approximately 4 uS or below. Therefore, in the vicinity of 3 uS, both outputs are valid, providing continuous conductance readings without interruption. FIG. 9 shows that the output of both comparators may be provided with suitable light emitting diodes for visible monitoring. Since these comparators are conventional, no further description is deemed necessary.

As mentioned previously in connection with FIG. 4b, the total conductance range of the circuit may be changed from the range of 0.01 to 1000 uS to the range of 0.1 to 10,000 uS by reducing the reference voltages $V2_1$ and $V2_2$ from 1 V to 0.1 V. With the latter ranges, the graphs as shown in FIGS. 7 and 8 will show a high range conductance of 10 to 10,000 uS and the output voltage will range from 0.01 V to 10 V and the low range conductance will show conductances from 0.1 to 100 and the output voltage will range from 0.003 V to 33 V. The overlapping of the ranges will occur at about 33 uS. The optimum switching frequency for the high conductance range will be from a frequency of 400 Hz to 1 kHz and for low conductance, a frequency of 10 Hz to 400 Hz.

Figure 10:
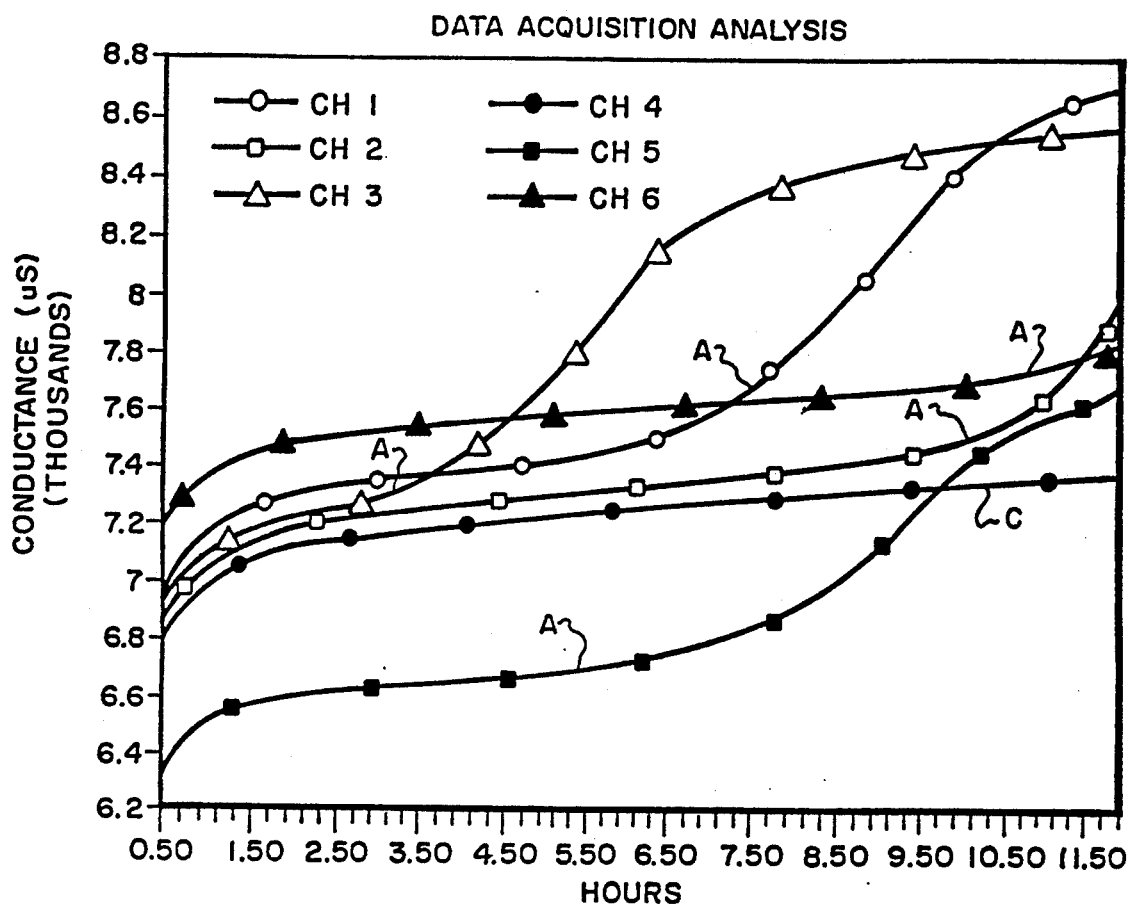
FIG. 10 shows a graph, conductance versus hours, of six solutions under test.

FIG. 10 are graphs of six different test solutions having been monitored by the conductance measurement circuit of this invention and also showing at points "A" where growth, or multiplication, of bacteriological colonies in the solutions under test began. The graph marked "C" is a control solution with no change in conductance. This FIG. also shows automatic data acquisition capability of this invention.

Figure 11:
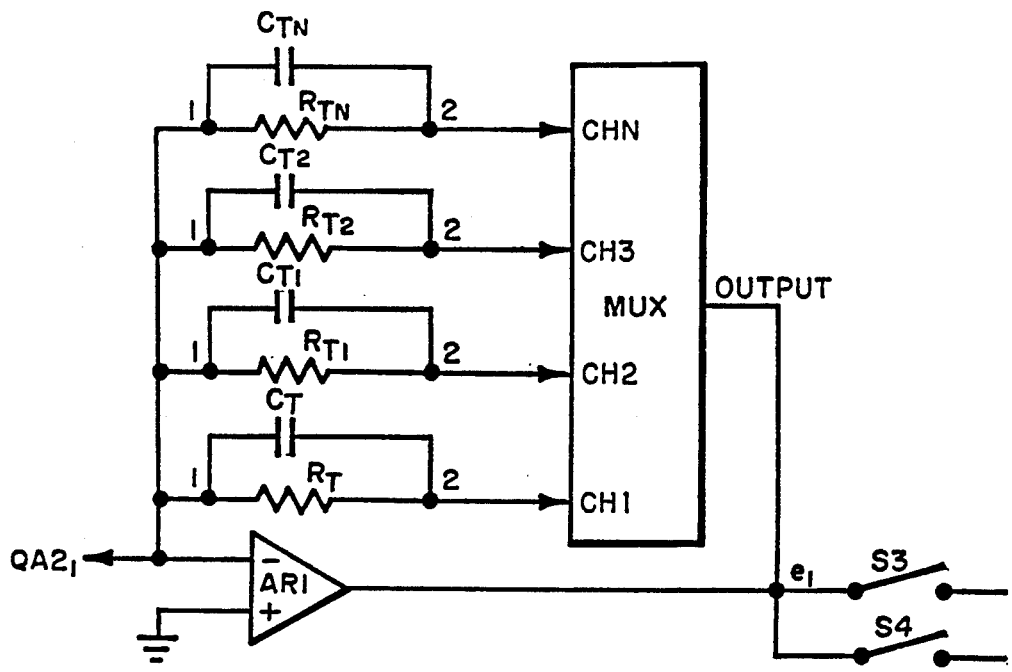
FIG. 11 is a schematic of a multiplexing circuit for continuously and automatically monitoring a plurality of test solutions.

FIG. 11 illustrates a multiplexer M in the conductance measurement circuit and suitably connected to the electrodes 1 and 2 of test solutions $R_{T1}$, $C_{T1}$ to $R_{TN}$, $C_{TN}$ and across AR1 for monitoring conductance of any number of such solutions.

APPENDIX I

Conductance Circuit Analysis

Figure 1:
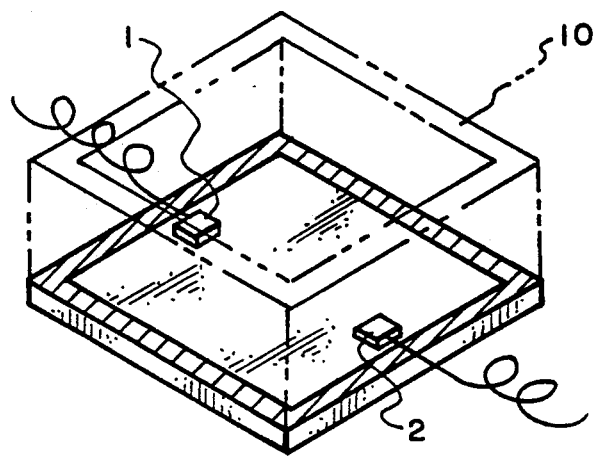
FIG. 1 is a schematic perspective view of a prior art chamber and solution under test with electrodes positioned to apply an electrical current to the solution.
Figure 2:
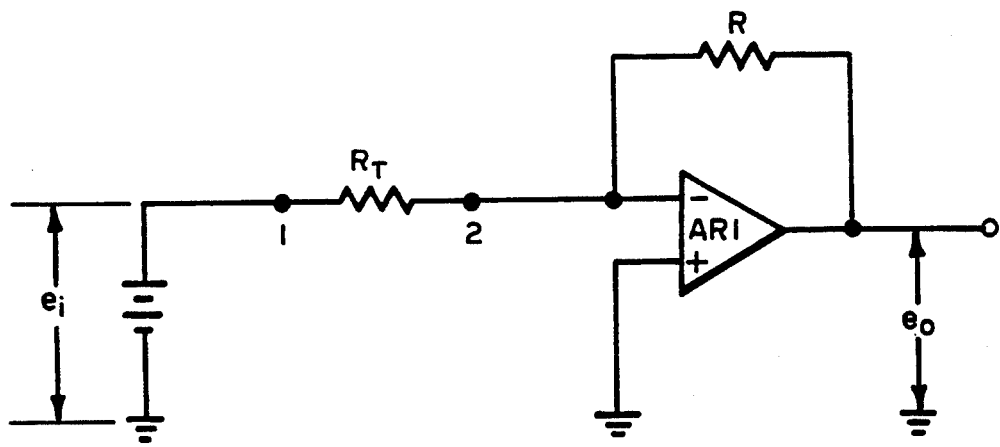
FIG. 2 is a schematic of a prior art measurement circuit for measuring the conductance of a solution under test.
Figure 3:
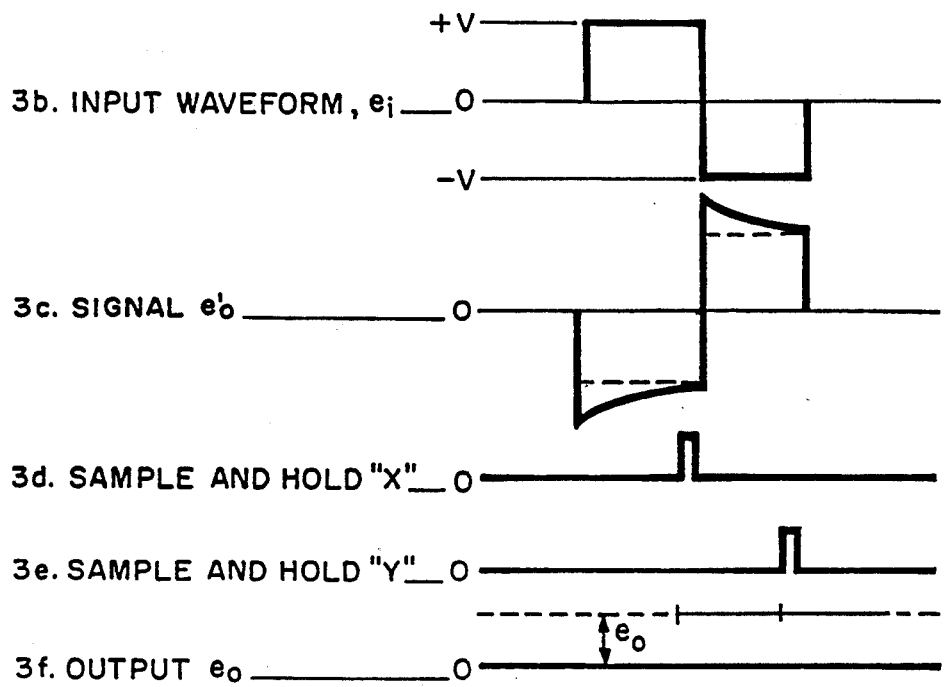
FIG. 3 illustrates the timing diagrams for the measurement circuit of FIG. 3a, FIG. 4a is a schematic of a DC conductance measurement circuit constructed according to the teachings of this invention to facilitate understanding of the operation of the circuitry.
Figure 3A:
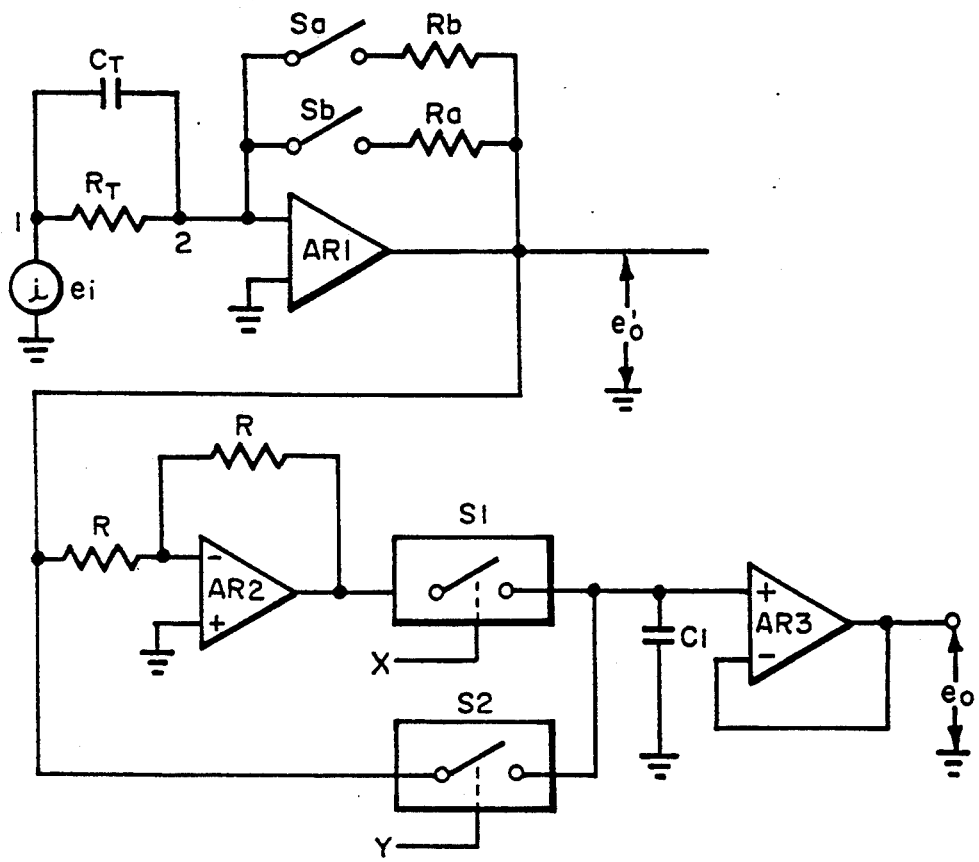
FIG. 3a is a schematic of a prior art conductance measurement circuit taking into consideration the capacitance of the electrodes in the test solution.

We wish to describe the relationship between the output voltage $e_o$ of FIG. 3 and the conductance of the test resistance, $R_T$.

Assumptions:
a. $e_{os1}$, $e_{os2}$, $i_{os1}$, and $i_{os2} = 0$,
b. $V_{be1} = V_{be2} = V_{be}$,
c. Q2A & Q2B are a matched pair, with identical temperature drift characteristics.

Operating Range of $e_{in}$: The voltage $e_{in}$ determines the current through Q2A and Q2B, and to cover a 5-decade range, the total required range of $e_{in}$ must be within practical limits to ensure reliable circuit operation. The expression for the voltage $V_{be}$ in FIG. 3 of the main text is $$V_{be} = \frac{kT}{q} \ln \frac{i_e}{I_s} \tag{1}$$

where
k = Boltzman's constant = 1.38062E-23 J/°K.,
T = absolute temperature (°K.),
q = unit charge = 1.60219E-19 coulombs,
$I_s$ = emitter saturation current (typically 10E-13A).

From FIG. 3 of the main text, the range of $i_{e1}$ and $i_{e2}$ required to measure conductance from 0.01 uS to 1000 uS is $$i_{e1} = -\frac{1 \text{ volt}}{R_T} \tag{2}$$

Solving eq. 2 for $I_{e1max}$ and $i_{e1min}$ using the minimum and maximum values of $R_T$, respectively, in Table I of the main text we obtain $i_{e1max} = -1\text{mA}$, $i_{e1min} = -10$ na.

Table I gives values of $e_{in}$ for $i_{e1} = i_{e2} = I_e$ of $-1$mA and $-10$nA, at temperatures of 0° C. and 55° C.

TABLE I

| $i_e$ (amps) | $V_{be}$ @ 0° C. (volts) | $V_{be}$ @ 55° C. (volts) |
|---|---|---|
| −1 mA | −.545 | −.709 |
| −10 nA | −.218 | −.284 |

Therefore the range of $e_{in}$ over the 5-decade conductance range and a typical operating temperature range of 0° C. to 55° C. is only −0.218 V to −0.709 V, a very easy range to accommodate.

Expression For Output Voltage vs Conductance: From FIG. 3 of the main text $$e_o = -i_{e2} R1 \quad (3a)$$

$$i_{e1} = -\frac{e_1}{R_T} \quad (3b)$$

But $i_{e1} = i_{e2}$, since Q2A and Q2B are a matched pair with identical temperature drift.

$$\therefore e_0 = e_1 \frac{R_1}{R_T} \quad (3)$$

The conductance under test, $G_T$, is the reciprocal of resistance.
Therefore $$G_T = 1/R_T$$

Since $e_1$ and R1 are constants, let $k = e_1 R1$.
Equation 3 becomes $$e_o = k G_T \quad (4)$$

which states that the output voltage $e_o$ is proportional to the conductance under test, $G_T$. Also, from the above discussion, $e_o$ is insensitive to temperature effects, assuming Q2A and Q2B are a matched pair.

APPENDIX II

Definitions

Conductance: Conductance, G, is the reciprocal of resistance, R:

$$G = 1/R.$$

Resistivity: Resistivity ($\rho$) is the resistance of a defined volume of a substance, and is defined by the relation $$\rho = R \frac{a}{L} \text{ ohm-cm} \quad (1)$$

where
R = Resistance measured between the electrodes,
a = Area of electrodes at each end of substance being measured,
L = Length of substance under test (distance between electrodes).

Conductivity: Conductivity ($\gamma$) is the reciprocal of resistivity, and is defined by the relation $$\gamma = \frac{1}{\rho} = \frac{L}{Ra} = G \frac{L}{a} \text{ Siemens cm} \quad (2)$$

The conductivity of a solution may be determined by measuring the conductance of the solution and applying a correction factor which is determined by the geometry of the measurement cell.

We claim:

1. A circuit for measuring the conductance of a solution under test which contains biological growth media where an increase in the conductance of the solution indicates growth, or multiplication, of bacteriological colonies and in which a pair of spaced-apart electrodes are placed for applying current to said solution, comprising,
   first means connected to said electrodes for applying current to said electrodes and for maintaining a voltage drop at a predetermined value regardless of any change in conductance of said solution,
   second means connected to said first means for adjusting the current necessary to maintain said voltage drop at said predetermined value,
   third means connected to said second means responsive to said second means to provide a current output responsive to the change in voltage drop so that the output of said second means remains constant,
   said second and third means including means which responds to a small change in voltage drop provides a large current output to produce a wide range of conductance measurement, and
   fourth means connected to said third means for producing an output proportional to conductance of said solution.

2. The circuit as claimed in claim 1 wherein said first means comprises,
   conductance responsive means having an output connected to one electrode and an input connected to the other electrode so that said conductive responsive means will have the same voltage drop as that of said solution,
   wherein said second and third means comprise,
   a variable voltage source, and
   a variable nonlinear voltage-controlled input resistance means connected to said variable voltage source and to said input to control current at said input according to the magnitude of the voltage applied by said variable voltage source, and
   wherein said fourth means comprises,
   a second variable nonlinear voltage-controlled input resistance means connected to the same variable voltage source and having the same characteristics as said first variable resistance means.

3. A circuit for measuring the conductance of a solution under test which contains biological growth media where an increase in the conductance of the solution indicates growth, or multiplication, of bacteriological colonies and in which a pair of spaced-apart electrodes are placed for applying current to said solution, comprising,
   means connected to said electrodes for applying current to provide a voltage drop of a predetermined value across said solution,
   conductance responsive means having an output connected to one electrode and an input connected to the other electrode so that said conductive responsive means will have the same voltage drop as that of said solution,
   a pair of circuits alternately connectable to said conductance responsive means and to said electrodes, means for alternately connecting each of said pair of circuits to said conductance responsive means and to said electrodes, each circuit having, means for applying an alternating AC current in square wave form to said conductance responsive means and to said electrodes to provide a peak voltage across said solution, means for maintaining the output voltage of said conductance responsive means at said predetermined value by varying the current level applied to said conductance responsive means and to said electrodes according to the change in voltage across said solution, means responsive to said variation in said current level for producing a circuit voltage output proportional to the change in voltage determined by said conductance responsive means, and means connected to both circuits for determining the output range of the two circuits producing a circuit output voltage representative of the change of conductance in said solution.

4. The circuit as claimed in claim 3 further including means for varying the frequencies of said alternating AC current.

5. The circuit as claimed in claim 4 further including a multiplexer for connecting a plurality of solutions under test to the conductance responsive means for measuring the conductance of said plurality of said solutions continuously.

6. The circuit as claimed in claim 4 wherein said conductance responsive means comprises, an operational amplifier with its negative input connected to one electrode and its output connected to the other electrode.

7. The circuit as claimed in claim 6 wherein said means for maintaining said output voltage at a predetermined value comprises, a comparator connected to the output of said operational amplifier to compare the voltage of the output of said operational amplifier with a precise voltage source to produce an error signal when the output voltage of said operational amplifier differs from the voltage of said precise voltage source, the output of said comparator being connected to a second voltage source which applies a current to the input of said operational amplifier to maintain the output of said operational amplifier at its predetermined value.

8. The circuit as claimed in claim 7 including a first transistor connected as a diode to the negative input of said operational amplifier and to the second voltage source and a second transistor also connected to the first transistor and to said second voltage source to reflect the current through said first transistor and produce said circuit voltage output.

9. The circuit as claimed in claim 8 wherein said first and second transistors are a matched pair.

10. The circuit as claimed in claim 9 wherein said means for applying current to the input of said operational amplifier comprises a voltage-controlled resistance connected between said second voltage source and the input of said first transistor.

11. A method for determining growth, or multiplication, of a solution under test containing biological growth media, said solution also containing electrodes so that said solution is subject to a current to measure the conductance of said solution as a first output voltage of a preselected level, comprising the steps of, applying current to said electrodes and to said solution, measuring the conductance of said solution wherein a change in conductance is a function of biological change by maintaining the first output voltage at said preselected level, logarithmically adjusting the current necessary to maintain the first output voltage applied to said electrodes at a selected level due to a change in conductance to provide a wide range of conductance measurements, and producing a second voltage output as a function of the adjusted current.

12. A circuit for measuring the conductance of a solution under test which contains biological growth media where an increase in the conductance of the solution indicates growth, or multiplication, of bacteriological colonies and in which a pair of spaced-apart electrodes are placed for applying current to said solution, comprising, an operational amplifier with its output connected to one electrode and its negative input connected to the other electrode so that said operational amplifier responds to conductance and produces an output voltage of a preselected value, a variable voltage source and a transistor connected as a diode between said voltage source and said negative input for applying current to said negative input for maintaining the output voltage at said preselected level regardless of any change in conductance, a second transistor connected as a diode to said variable voltage source with characteristics substantially identical to the first transistor, the output of said second transistor being connected to a second operational amplifier having a fixed resistance feedback to provide a circuit output proportional to change in conductance.

13. A circuit for measuring the conductance of a solution under test which contains biological growth media where an increase in the conductance of the solution indicates growth, or, multiplication, of bacteriological colonies and in which a pair of spaced-apart electrodes are placed for applying current to said solution, comprising, an operational amplifier with its output connected to one electrode and its negative input connected to the other electrode for applying current to said electrodes and to said solution so that said operational amplifier responds to the conductance of said solution and produces an output voltage of a preselected value, and a variable voltage source connected to said output of said amplifier and a transistor connected as a diode between said voltage source and said negative input for applying current to said negative input for maintaining the output voltage of said amplifier at said preselected value regardless of any change in conductance of said solution, said transistor having a logarithmic output response so that a small change in voltage from said voltage source produces a large change in current through said transistor because of the logarithmic response of said transistor thus providing a wide range of current variation through said solution from a small change in the voltage from said voltage source.

14. The circuit as claimed in claim 13 further including a second transistor connected as a diode to said variable voltage source with characteristics substantially identical to the first transistor to mirror the current through said first transistor and produce an identical output current, and means connected to the output of said second transistor to transform said identical output current to a linear voltage proportional to the current applied to said solution which is directly proportional to the conductance changes in said solution over a wide range, typically five decades.

15. The circuit as claimed in claim 13 further including a second transistor connected as a diode to said variable voltage source with characteristics substantially identical to the first transistor and having its output connected to a second operational amplifier having a fixed resistance feedback to provide a wide range circuit output proportional to a wide range in conductance change.

16. A measuring circuit for measuring the conductance of a solution under test which contains biological growth media where an increase in the conductance of the solution indicates growth, or multiplication, of bacteriological colonies and in which a pair of space-apart electrodes are placed for applying current to said solution, comprising,
- conductance responsive means having an output connected to one electrode and an input connected to the other electrode for applying current to said electrodes to provide a voltage drop of a first polarity and of a predetermined value across said solution, said conductance responsive means having the same voltage drop as that of said solution,
- a first circuit means for maintaining the voltage drop across said solution at a constant value by maintaining the output voltage of said conductance responsive means at a constant value by varying the current level applied to said conductance responsive means and to said electrodes according to any change in voltage across said solution, comprising,
  - a first variable voltage source having a source output voltage of a first polarity responsive to any change in the output voltage in said conductive responsive means, and
  - a first variable input resistance having logarithmic characteristics connected between said variable voltage source and said conductive responsive means so that a small change in voltage from said voltage source produces a large change in current flow in one direction through said first variable input resistance because of the logarithmic response of said first variable resistance thus providing a wide range of current variation through said solution from a small change in voltage from said voltage source.

17. The circuit as claimed in claim 16 further including a second circuit means connectable alternately to this same conductive responsive means when said first circuit means is disconnected from this same conductive responsive means for maintaining the voltage drop across said solution at a second constant value by maintaining the output voltage of this same conductance responsive means at a second constant value by varying the current level applied to said conductance responsive means and to said electrodes according to any change in voltage across said solution, comprising,
- a second variable voltage source having a second source output voltage of a second polarity responsive to any change in the output voltage in said conductive responsive means, and
- a second variable input resistance having logarithmic characteristics connected between said second variable voltage source and said conductive responsive means so that a small change in voltage from said second voltage source produces a large change in current flow in a direction opposite from the current flow in said first circuit means through said first variable input resistance of the logarithmic response of said second variable input resistance thus providing a wide range of current variation through said solution from a small change in the voltage from said second voltage source,
- means for alternately connecting said first and second circuit means to said conductive responsive means and to said electrodes at a predetermined rate depending upon the conductance characteristics of the solution under test, and
- means for determining which of said circuit means is connected to said conductance responsive means at the time said conductance responsive means is responding to changes in said solution.

18. The circuit as claimed in claim 16 further including a third variable input resistance having the same characteristics as said first variable input resistance to mirror the current of the first polarity through said first variable input resistance and produce an identical output current and means connected to the output of said third variable input resistance to transform the current from said third variable input resistance into a linear voltage proportional to the current of the first polarity applied to said solution which is directly proportional to conductance changes in said solution over a wide range.

19. The circuit as claimed in claim 17 further including a fourth variable input resistance having the same characteristics as said second variable input resistance to mirror the current of the second polarity through said second variable input resistance and produce an identical output current and means connected to the output of said fourth variable input resistance to transform the current from said fourth variable input resistance into a linear voltage proportional to the current of the second polarity applied to said solution which is directly proportional to conductance changes in said solution over a wide range.

* * * * *